United States Patent
Langadi

(10) Patent No.: US 8,384,435 B2
(45) Date of Patent: Feb. 26, 2013

(54) CLOCK SWITCHING CIRCUIT WITH PRIORITY MULTIPLEXER

(75) Inventor: Saya Goud Langadi, Kodihalli (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/984,764

(22) Filed: Jan. 5, 2011

(65) Prior Publication Data

US 2012/0169373 A1 Jul. 5, 2012

(51) Int. Cl.
*H03K 19/096* (2006.01)

(52) U.S. Cl. .............................. 326/93; 327/99; 327/298

(58) Field of Classification Search .................. None
See application file for complete search history.

(56) References Cited

U.S. PATENT DOCUMENTS

| | | | | | |
|---|---|---|---|---|---|
| 5,357,146 | A | * | 10/1994 | Heimann | 327/292 |
| 5,604,452 | A | * | 2/1997 | Huang | 327/99 |
| 6,600,345 | B1 | * | 7/2003 | Boutaud | 327/99 |
| 7,259,598 | B2 | * | 8/2007 | Wu et al. | 327/99 |
| 2008/0080648 | A1 | * | 4/2008 | Leung et al. | 375/354 |

* cited by examiner

*Primary Examiner* — Crystal L Hammond
(74) *Attorney, Agent, or Firm* — Lawrence J. Bassuk; W. James Brady; Frederick J. Telecky, Jr.

(57) ABSTRACT

A glitch free clock switching circuit includes a first enable synchronization logic that generates a first clock enable in response to a first enable from a first enable generation logic. The clock switching circuit includes a second enable synchronization logic that generates a second clock enable in response to a second enable from a second enable generation logic. A logic gate is coupled to an output of the second enable synchronization logic that selects the second clock signal as a logic gate output if the second enable is logic high. A priority multiplexer receives a first clock signal, the first enable and the logic gate output. The multiplexer configured to select the first clock signal as the clock output if the first enable is logic high, irrespective of the logic gate output.

Figure 1:
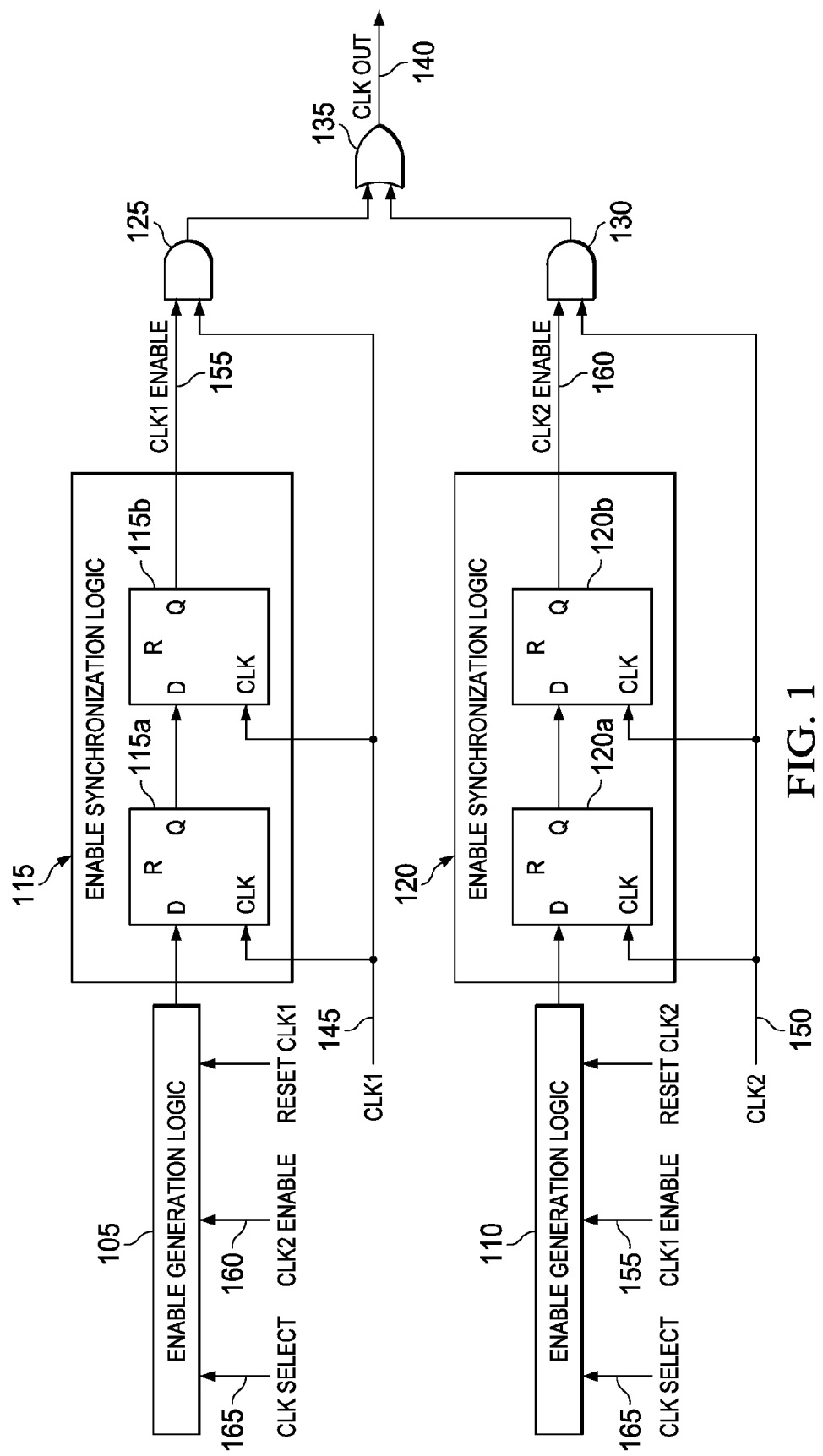

10 Claims, 3 Drawing Sheets ized signal called CLK2 Enable (online 160) is used to
CLOCK SWITCHING CIRCUIT WITH PRIORITY MULTIPLEXER

TECHNICAL FIELD

Embodiments of the disclosure relate to clock switching circuits in application specific integrated circuits (ASIC).

BACKGROUND

An ideal clock switching circuit switches between a set of clock sources without generating glitches. Inputs to clock switching circuit include two asynchronous clocks and a signal which selects one of the clock sources. Output of the clock switching circuit is one of the two asynchronous clock sources depending on the polarity of the signal that selects one of the clock sources. During and after power up (when RESET is released) of the clock switching circuit, glitches can occur at the output of the clock switching circuit. Say CLK 1 and CLK 2 are the two asynchronous signals and CLK 1 is the default clock signal. CLK2 may or may not be active during the power up. If CLK 2 is inactive during power up, then the flip flop that drives an enable of CLK 2 is not known. If this comes up as logic high and CLK 2 is also at logic high, then the output of the clock switching circuit will always be logic high. This issue can be solved by using asynchronous reset to the CLK 2 domain flip flops. Since reset is used asynchronously in the CLK2 domain, when reset is released, a recovery or removal violation can occur on the flip flop which drives the enable of CLK2-AND gate. If the flip flop is settled to '1' then there can be glitch on OR gate output since both clock to OR gate are enabled for 1 or 2 cycles.

Once a clock source has been selected, during the course of operation the selected clock source can be missing or can become faulty. In certain applications, which needs to be fault tolerant, there will be circuitry which can monitor the clocks and indicate the faulty condition. Upon the detection of clock fault, this needs to be rectified by switching to alternate clock source. This can cause problems as the synchronizers of the selected clock source cannot change state due to absence of a clock signal. As a result, the clock switching circuit will never switch to alternate clock source. Basically a deadlock occurs in the circuit.

SUMMARY

An example embodiment provides a clock switching circuit. The circuit includes a first enable synchronization logic that generates a first clock enable in response to a first enable from a first enable generation logic, the first enable synchronization logic configured to receive a first clock signal. A second enable synchronization logic generates a second clock enable in response to a second enable from a second enable generation logic. The second enable synchronization logic is configured to receive a second clock signal. A logic gate receives the second enable and the second clock signal, the logic gate selects the second clock signal as a logic gate output if the second enable is logic high. A priority multiplexer receives the first clock signal, the first enable and the logic gate output. The multiplexer is configured to select the first clock signal as the clock output if the first enable is logic high, irrespective of the logic gate output. In another example embodiment the clock switching circuit includes a missing clock detection circuit that detects absence of the second clock signal, wherein if the second clock signal is missing, the missing clock detection circuit sends a CLK OFF signal to the second enable synchronization logic that breaks a feedback path such that an output of the clock switching circuit is switched from the second clock signal to the first clock signal in response to the CLK OFF signal. Other aspects and example embodiments are provided in the Drawings and the Detailed Description that follows.

BRIEF DESCRIPTION OF THE VIEWS OF DRAWINGS

Figure 2:
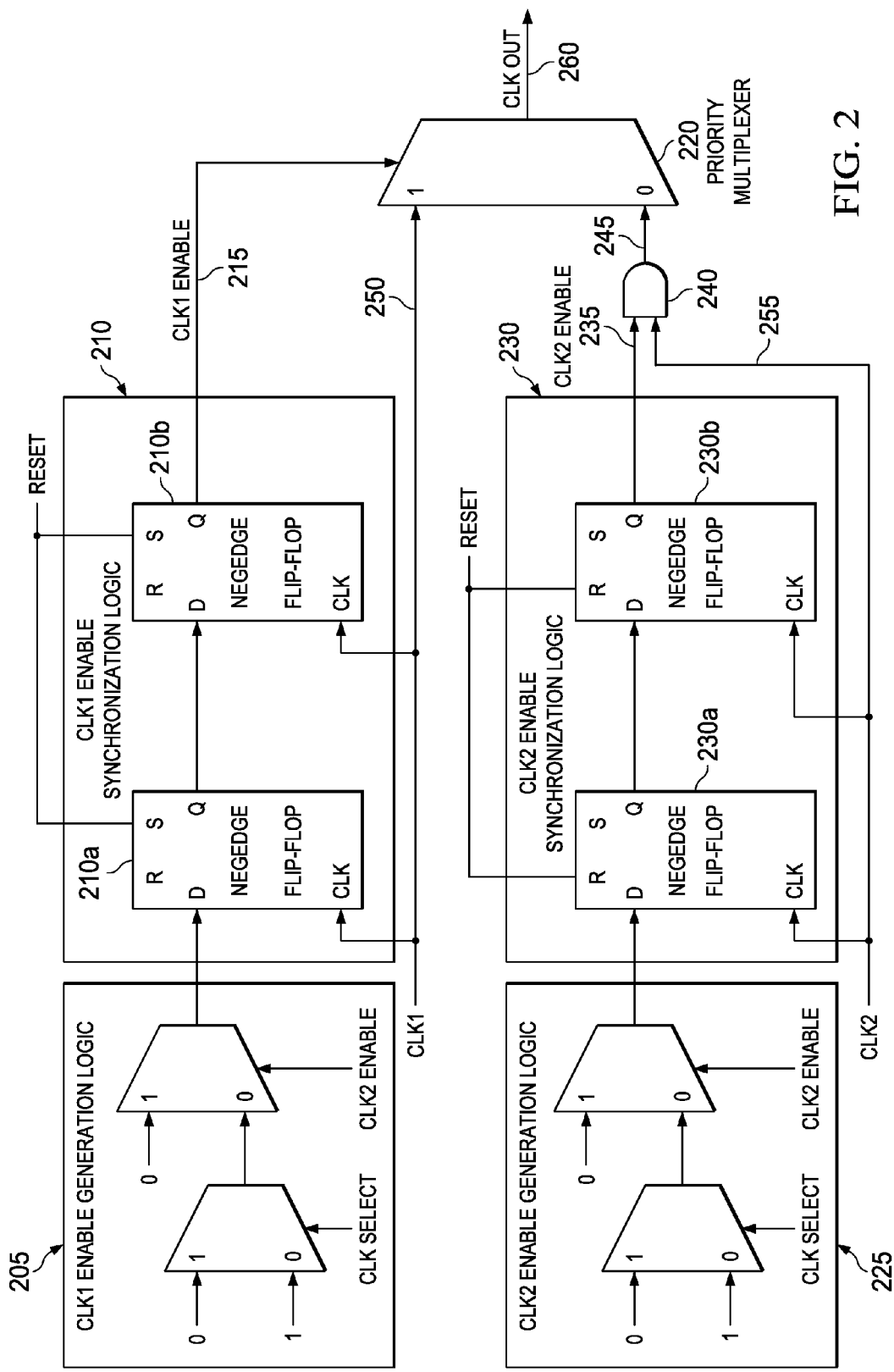
Figure 3:
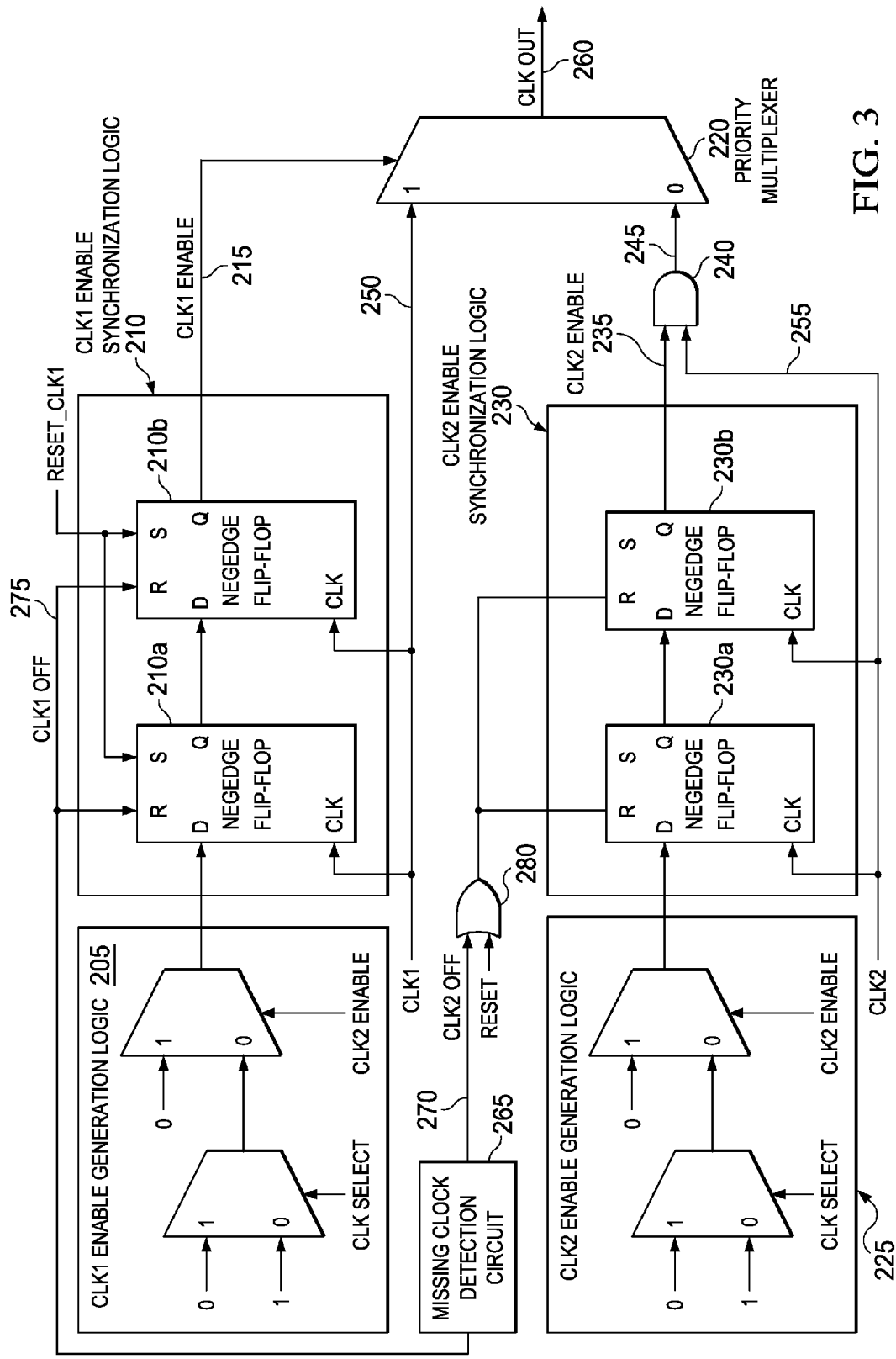

FIG. 1 illustrates a clock switching circuit;
FIG. 2 illustrates a clock switching circuit according to an embodiment; and
FIG. 3 illustrates a clock switching circuit according to another embodiment;

DETAILED DESCRIPTION OF THE EMBODIMENTS

The clock switching circuit as illustrated in FIG. 1 includes two clock domains, each having enable generation logics (105 and 110), enable synchronization logics (115 and 120), two AND gates (125 and 130) and an OR gate 135. The enable generation logic 105 receives a CLK select, CLK2 enable and a RESET CLK2. Similarly, enable generation logic 110 receives a CLK select, CLK1 enable and RESET CLK2. Outputs of the enable generation logics 105 and 110 are connected to enable synchronization logics 115 and 120 respectively. The enable synchronization logics (115 and 120) include two negative edged flip-flops 115A and 115B and 120A and 120B connected to each other. Flip-flops receive two asynchronous clock signals CLK1 and CLK2 on lines 145 and 150 respectively. Outputs of the enable synchronization logics, CLK1 enable on line 155 and CLK2 enable on line 160, are connected to AND gates 125 and 130 respectively. Outputs of the AND gates are connected to the OR gate 135. An output from the OR gate is the clock output CLK OUT, taken on line 140.

A select signal CLK select (165) is used to select one of the clock sources. In one example, when CLK select (165) is low CLK2 is to be selected and when CLK select (165) is high CLK1 is to be selected. In order to make the output of clock switching circuit CLKOUT (140) glitch free at any point of time, only one clock needs to be enabled by AND gates 125 and 130. The AND gate 125 outputs CLK1 (145) when CLK1 Enable is high and otherwise it is inactive and the output of AND gate (125) is low. The AND gate 130 will output CLK2 (150) when CLK2 Enable is high otherwise it is turned off and output of AND gate (130) is low. In order to avoid glitches on AND gate (125), CLK1 Enable (155) should be modified such that it is to be made high or low on falling transition of CLK1 (145). Similarly CLK2 Enable should be modified such that it is high or low on negative transition of CLK2 otherwise glitches on AND gate (130) is unavoidable.

To be able to modify the enables on falling transition of clock, the signal CLK1 Enable (155) and CLK2 Enable (160) are generated by the negative edge flop which is part of enable synchronization circuits 115 and 120 respectively. The D input of synchronization circuits 115 and 120 are asynchronous to clock signals CLK1 (145) and CLK2 (150) respectively. Since D input is asynchronous, the D input needs to be synchronized to its clock domain. D input of enable synchronization logic (115) is synchronized and synchronized signal called CLK1 Enable (on line 155) is used to activate or inactivate CLK1 on AND gate (125). Similarly D input of enable synchronization logic (120) is synchronized and synchronized signal called CLK2 Enable (online 160) is used to activate or inactivate CLK2 on AND gate (130). The front end circuits of enable synchronizer circuits 115 and 120 are designed such that D inputs of enable synchronizer circuits are not high at any point of time. In order to make the D inputs mutually exclusive, enable synchronization logic 115 outputs is feedback to enable synchronization logic 120 through the enable generation logic 110. Similarly, enable synchronization logic 120 output is feedback to enable synchronization logic 115 through the enable generation logic 105.

As long as CLK2 Enable is high, D input of enable synchronization logic 115 is made low irrespective of CLK select (select signal). Similarly as long as CLK1 Enable is high, D input of enable synchronization logic 120 is made low irrespective of CLK select. This circuit has limitations when one of the CLK sources CLK1 (145) and CLK2 (150) are not guaranteed to be active always.

It is noted that any clock switch switching circuit will have default clock source selection when circuit is powered up. In order to explain the limitations it is assumed that CLK1 (145) is default source which means clock switching circuit will output CLK1 (145) after reset. Resets used in this circuit are RESET CLK1 and RESET CLK2. Resets are synchronous to CLK1 (145) and CLK2 (150) respectively. Resets are generated from common RESET. All resets are assumed to active high that when high circuit will be in reset.

When reset is released in the aforementioned clock switching circuit a glitch occurs. This is explained now considering two cases. Case 1: CLK2 is not toggling or clocking during reset phase of the design; that is signals RESET CLK1 and RESET CLK2 are high. Since clock to enable synchronization logic 120 is inactive, D input which is low is not propagated through enable synchronization logic 120. This makes the CLK2 Enable un-initialized. After power up flip flops (120A, 120B) in enable synchronization logic 120 can get initialized to any value either low or high. When CLK2 is faulty it can hold either low or high values. If flip flop 120B in the enable synchronization logic 120 is initialized to high during power up then CLK2 enable will be high. Assuming CLK2 is holding a high the output of AND gate (130) is high, which forces output of OR gate (135) to high independent of the other input which is connected to AND gate (125). In such case CLK1 will be not selected as clock source and output (140) remains high. This issue can be solved by using asynchronous reset to flops in enable synchronization logic 120, however this cannot be done in the case when one of the clock signals is faulty for which the details are explained in case 2 below.

Case 2: Using asynchronous reset to flops 120A and 120B in enable synchronization logic 120 solves the problem of initialization if CLK2 (150) is inactive during reset, assuming that RESET CLK is connected to R (reset pin of the flip flop) of CLK2 synchronizer. If CLK2 (150) is active, then when RESET CLK which is unsynchronized is released a timing violation of asynchronous pins of flip flops occurs. In this case, output of the enable synchronization logic 120 can be high for 1 or 2 cycles if flops 120A and 120E are resolved to high after meta-stability. Due to this AND gate (130) outputs CLK2 (150) for 1 or 2 cycles, at the same time AND gate (125) outputs CLK1 (145) as CLK1 is default clock source. On the input of OR gate (120) both the clocks will be active, as results of this there will be glitches on CLKOUT (121).

Further, when selected clock source is faulty, switching to the other clock source can generate glitch at the CLKOUT 140. To enable glitch free clock switching there includes a feedback path from one clock domain to the other. The feedback signals are CLK1 Enable (155) and CLK2 enable (160) respectively. For instance clock switching circuit is outputting CLK2 (150) and CLK2 (150) becomes faulty, in this case if trying to switch to CLK1 (145) by changing CLK select (165) to high will not switch clocks because front end circuit of enable synchronization logic 115 depends on CLK2 Enable (160) and this needs to be low to make the D input of enable synchronization logic 115 to high. Since CLK2 is faulty or missing enable synchronization logic 115 will not respond hence CLK2 enable will never become low, as a result of this there is dead lock.

The limitations of clock switching circuit of FIG. 1 are overcome by several embodiments as illustrated in FIG. 2 and FIG. 3. Specifically, FIG. 2 illustrates a clock switching circuit that generates a glitch free clock when reset is released according to an embodiment. Further, FIG. 3 illustrates a clock switching circuit that can switch between the clock sources when a selected clock source is missing or faulty according to another embodiment.

Referring now to FIG. 2, the clock switching circuit includes two clock domains, each having enable generation logics (CLK1 enable generation logic 205 (first enable generation logic) and CLK2 enable generation logic 225 (second enable generation logic)), enable synchronization logics (CLK1 enable synchronization logic 210 (first enable synchronization logic) and CLK2 enable synchronization logic 230 (second enable synchronization logic)). The enable generation logic 205 receives a CLK select, CLK2 enable (forming a second feedback path from second clock domain to the first clock domain) and a RESET CLK2. Similarly, enable generation logic 230 receives a CLK select, CLK1 enable (forming a first feedback path from first clock domain to the second clock domain) and RESET CLK2. Outputs of the enable generation logics 205 and 225 are connected to enable synchronization logics 210 and 230 respectively. Each of the enable synchronization logics (205 and 225) include two negative edged flip-flops (210A, 210B and 230A, 230B) connected to each other. Flip-flops 210A and 210B receive asynchronous clock signals CLK1 (first clock signal) on line 250 and flip-flops 230A and 230B receive CLK2 on lines 255 respectively. Outputs of the CLK2 enable synchronization logic 230 (CLK2 enable on line 235) is connected to AND gate 240. Output of the AND gate 240 (logic gate output) is connected to a priority multiplexer 220. An output of CLK1 enable synchronizer logic 210 (CLK1 enable on line 215) and CLK1 on line 250 are also connected to the priority multiplexer 220. An output from the priority multiplexer 220 is the clock output CLK OUT, on line 260.

Operation of the clock switching circuit including enable generation and enable synchronization is same as that of clock switching circuit illustrated in FIG. 1 and as explained previously. In one embodiment, AND-OR logic (125, 130 and 140) structure on the clock switching circuit (FIG. 1) has been modified and is replaced with priority multiplexer (220). Also flip flops in CLK2 enable synchronization logic (230) are reset asynchronously using RESET signal. Due to the limitation as previously explained, AND gate (240) can either output CLK2 continuously (case 1) or outputs clock for 1 or two cycles (case 2). However due to the priority multiplexer, clock on line 245 which is output of AND gate 240, will not be propagated to CLKOUT (260) because during and after reset (when RESET is high) CLK1 Enable (215) is high. When reset is released, CLK2 which is enabled (due to case2) for 1 or 2 cycle will not affect the output of clock switching circuit. In other words, during this time the priority multiplexer (220) blocks the glitch propagating to CLKOUT. In other words, the priority multiplexer 220 is configured to select CLK1 as the clock output if CLK1 enable is a logic high, irrespective of the output of the AND gate 240.

In the event when one of the clock source is faulty, missing or inactive, switching the clock output to other clock is not possible due to the existence of feedback from first clock domain (CLK1 155 connected to enable generation logic 110) and from the second clock domain CLK2 (CLK2 160 connected to enable generation logic 105). Solution to this limitation is illustrated in FIG. 3. An embodiment includes a missing clock detection circuit 265 which can detect the absence of a clock signal, which is common in fault tolerant ASICs. Outputs of the missing clock detection circuit 265 are CLK1 OFF on line 275 (indicative of faulty CLK1) and CLK2 OFF on line 270 (indicative of faulty CLK2). In response to the CLK OFF signal (CLK1 OFF or CLK2OFF), a corresponding feedback path is broken such that an output of the clock switching circuit is switched from one clock source to the other. In one embodiment, CLK1 OFF and CLK2 OFF include two memory mapped bits which can be modified by the processor. By using these bits processor communicates missing clock information to the clock switching circuit. This information is used by the clock switching circuit to break the feedback loop between CLK1 enable synchronization logic (210) and CLK2 enable synchronization logic (230) and vice-versa.

Working of the clock switching circuit of FIG. 3 according to an embodiment is explained below. The clock switching circuit of FIG. 3 includes a first feedback path (CLK2 enable coupled to enable generation logic 205) and a second feedback path (CLK1 enable coupled to enable generation logic 225). Assume that CLK Select is low; which means clock switching circuit is outputting CLK1 (250) on CLKOUT (260). Also assume that during the operation, CLK1 (250) becomes faulty. Upon detecting CLK1 (250) fault condition, processor might switch to alternate clock source (CLK2, 255) by changing the CLK select to low. However due to the faulty clock (CLK1, 250) CLK1 Enable (215) will never become zero causing a dead lock. This dead-lock/feedback can be broken by communicating faulty information to clock switching circuit using CLK1OFF-M105, CLK2OFF-M205. In this case, CLK1 OFF (275) is made high to indicate that CLK1 (250) is faulty in addition to making the CLK select to high. Then CLK1 Enable (215) is forced to low asynchronously hence breaking the feedback loop. Since CLK1 enable is forced to low, D input of CLK2 enable synchronization logic is made high immediately. Eventually this will make the CLK2 enable (235) high and CLK2 (255) will be outputted on CLK OUT (260). Forcing CLK1 enable (215) to low asynchronously does not cause any meta-stability issue on flop because CLK1 (250) is inactive.

In the foregoing discussion, the term "connected" means at least either a direct electrical connection between the devices connected or an indirect connection through one or more passive or active intermediary devices. The term "circuit" means at least either a single component or a multiplicity of components, either active or passive, that are connected together to provide a desired function. The term "signal" means at least one current, voltage, charge, data, or other signal.

The forgoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

What is claimed is:

1. A clock switching circuit that provides a clock output selectable from a plurality of clock signals, the clock switching circuit comprising:
   A. a first enable synchronization logic that generates a first clock enable signal in response to a first enable signal from a first enable generation logic, the first enable synchronization logic configured to receive a first clock signal;
   B. a second enable synchronization logic that generates a second clock enable signal in response to a second enable signal from a second enable generation logic, the second enable synchronization logic configured to receive a second clock signal;
   C. a logic gate having one input connected to the second clock enable signal, another input connected to the second clock signal, and an output; and
   D. a priority multiplexer having the clock output, a first input connected to the first clock signal, a second input connected to the logic gate output, and a control input connected to the first clock enable signal.

2. The clock switching circuit of claim 1, wherein at least the first clock signal and the second clock signal of the plurality of clock signals are asynchronous clock signals.

3. The clock switching circuit of claim 1, wherein the first enable synchronization logic comprises a first plurality of negative edge flip flops that are coupled to each other and the second enable synchronization logic comprises a second plurality of negative edge flip-flops that are coupled to each other.

4. The clock switching circuit of claim 3, wherein the first plurality of negative edge flip flops receives the first enable signal and generates the first clock enable signal; and wherein the second plurality of negative edge flip flops receives the second enable signal and generates the second clock enable signal.

5. The clock switching circuit of claim 4, wherein the plurality of negative edge flip flops receives a RESET signal at power up of the clock switching circuit.

6. The clock switching circuit of claim 1, wherein the first enable generation logic generates the first enable signal in response to a first clock select signal and the second clock enable signal; and wherein the second enable generation logic generates the second enable signal in response to a second clock select signal and the second clock enable signal.

7. The clock switching circuit of claim 1, wherein the first clock signal is a default clock signal.

8. The clock switching circuit of claim 7, wherein the first enable signal is logic high at reset.

9. The clock switching circuit of claim 1, wherein the priority multiplexer is configured to block a glitch at the logic gate output.

10. The clock switching circuit of claim 1, wherein the logic gate includes an AND gate.

* * * * *